United States Patent [19]
Lawton

[11] Patent Number: 5,987,145
[45] Date of Patent: Nov. 16, 1999

[54] DIGITAL AUDIO EQUALIZER

[76] Inventor: Jeffrey C. Lawton, 1675 Chapel Dr. #8, Camarillo, Calif. 93010

[21] Appl. No.: 08/746,407

[22] Filed: Nov. 8, 1996

[51] Int. Cl.[6] ...................................................... H03G 5/00
[52] U.S. Cl. ............................................................ 381/103
[58] Field of Search ................................ 381/97, 98, 101, 381/103

[56] References Cited

U.S. PATENT DOCUMENTS 5,418,859  5/1995  Cho ............................................ 381/98

OTHER PUBLICATIONS

1992 Kraght, "A Linear Phase Digital Equalizer . . . ".
1992 Mitchell, "Multirate Filters . . . ".

*Primary Examiner*—Minsun Oh Harvey
*Attorney, Agent, or Firm*—Dennis W. Beech

[57] ABSTRACT

A digital multi-bandpass audio equalizer which is comprised of an analog multiplexer (10), a two-channel analog-to-digital converter (12), a digital-to-analog converter (22), and a digital signal processor which is programmed to provide an arrangement consisting of combined anti-alias filters/sample rate decimators (14), memory buffers at various sample rates (16), bandpass filters (18), and "virtual" potentiometers (20), structured in such a way that the digital filter elements which are operated at low frequencies are implemented at correspondingly low sample rates in order to minimize the amount of calculation involved, maximize computational efficiency and avoid the phenomenon of "rate inversion".

6 Claims, 1 Drawing Sheet

DIGITAL AUDIO EQUALIZER

BACKGROUND—FIELD OF INVENTION

This invention relates to the digital processing of audio signals, specifically to the use of a suitable interconnection of linear-phase filters and sample rate decimators to perform the function of audio equalization.

BACKGROUND—DESCRIPTION OF PRIOR ART

The history of audio equalization goes all the way back to the invention of the telephone and to Maxwell's analysis which led to the creation of the telephone loading coil and perhaps earlier. Formal study of the theory of audio filters grew out of the development of electrical filters for radio frequency transmission and reception. Modern equalizers find their place every day in the fields of analog tape and disc recording, in pre-emphasis/de-emphasis filters in broadcasting, and in audio recording, mixing and reproduction, among other uses.

The first equalizers used in the commercial broadcast and film industries evolved from similar devices used in other industries such as telephone transmission. These early devices used passive components in connections called RLC networks (named after the letters electronic engineers use to represent resistance, inductance and capacitance, respectively) which was generally followed by an amplifier to "make up" the inevitable loss. As inexpensive operational amplifiers became available in the early 1970's, this "passive" technology was gradually replaced with so-called "active" filters which incorporated the amplifier stage as an integral part of the filter. The primary advantage of the active filter was that designs were discovered which did not use any actual inductors at all resulting in a substantial cost savings and somewhat less susceptible to hum pickup from stray AC fields.

At about the same time, researchers working in various fields of weapons systems and telecommunications started to develop the theory of digital signal processing, which involved the organization of so-called sampled-data systems and the development of a whole new mathematical idiom, the z-transform, to describe their operation. It wasn't until about 1985 that the first integrated circuit implementation of a DSP device became commercially available and began to popularize the technology.

There are many ways to build a filter using DSP technology. but most of them can be classified into one of three categories: infinite-impulse response (also known as IIR), finite-impulse response (FIR), and transform-based approaches (based upon converting the signal to frequency domain and back, usually using a Fast Fourier Transform process and its inverse, or an equivalent method). Each of these methods has its strengths and drawbacks when applied to audio applications. IIR filters definitely use the fewest DSP processing cycles per filter section, but the resultant filters are non-minimum phase; in addition, when the ratio of the sampling rate selected to the nominal "corner" frequency of the filter becomes high, as happens when IIR filters are designed for the lower audio frequencies, their requirement for extremely precise coefficients generally requires that they be implemented on a 24-bit rather than a 16-bit processor, at somewhat higher cost. The FIR filters are both linear-phase and minimum-phase, so they have far fewer adverse effects on the signal; in addition, the architecture of most modern DSP's is generally optimized for efficient computation of FIR filters, so that a single "tap" or computation point of an FIR filter generally takes either one or two clock cycles whereas each point in an IIR filter may take from 20 to 50 cyles. However, FIR filters also have problems at the lower audio frequencies; since the number of points to be computed increases as the inverse of the FIR "corner" frequency, if a designer tries to implement these filters at the system sample rate (as they generally do), several thousand processing cycles per sample are necessary to calculate each filter at the lower frequencies, but current technology only supports several hundred per sample per processor (at the standard sampling rates of 44.1 or 48 kilohertz), so that these filters are seldom used in real-time applications. Fast-Fourier Transforms require a high degree of frequency precision and hence a high number of sample points per transform to avoid audible distortion, so they take even more cycles than FIR filters; their much-ballyhooed "efficiency" really only takes effect when when the need is for a linear filter resolution in absolute bandwidth, but the need in an audio equalizer is for resolution as a constant percentage of bandwidth, so that the efficiency goes down dramatically for FFT-based approaches in constant-percentage-bandwidth (constant "Q") applications.

To cite an example of the lack of efficiency in direct calculation of FIR filters, if we use the DFDP tool and ask it to generate a Parks-McClellan bandpass filter at 25 hertz when the sample rate is 44.1 kilohertz, it will tell us that well over 4000 filter taps must be used. Thus, just implementing the lowest octave on a graphic equalizer will require that over 12.000 taps be calculated for a one-third-octace filter!! Since the number of taps required goes down in rough proportion as the frequency increases, it would take approximately double this number or 24,000 multiply-accumulate instructions to be implemented in a 22.6 microsecond interval, which works out to well over 1000 MIPS! As you can see, there is no currently available digital filter bank mechanism which is linear-phase, does all one-third octave bands and requires less than, say, 600 MIPS (or roughly 20 MIPS per band "averaged", although as you can see this kind of "average" means almost nothing on a per-band basis).

OBJECTS AND ADVANTAGES

The design of a digital audio equalizer should allow the convenient adjustment of the amplitude of each individual passband with minimal interaction on other bands. It should also take into account the fact that a given audio program may in fact pass through several generations of equalizers, so that phase shift through any one particular passband should be ideally no worse than that of an absolute time delay, or degeneration of the signal may in fact be audible through multiple stages of equalization. It should also be possible to realize such a design with an amount of digital signal processing power, or its logic-based equivalent, that is small enough to be affordable, portable and reliable enough for field application.

In accordance with the description presented herein, other objectives of this invention will become apparent when the description and drawings are reviewed.

DRAWING FIGURES

FIG. 1 shows the conceptual signal flow diagram of a typical single-channel equalizer which is implemented using the techniques described herein to calculate the equalizer algorithm efficiently and thus avoid the problem of rate inversion.

DESCRIPTION OF THE PREFERRED EMBODIMENT

Figure 1:
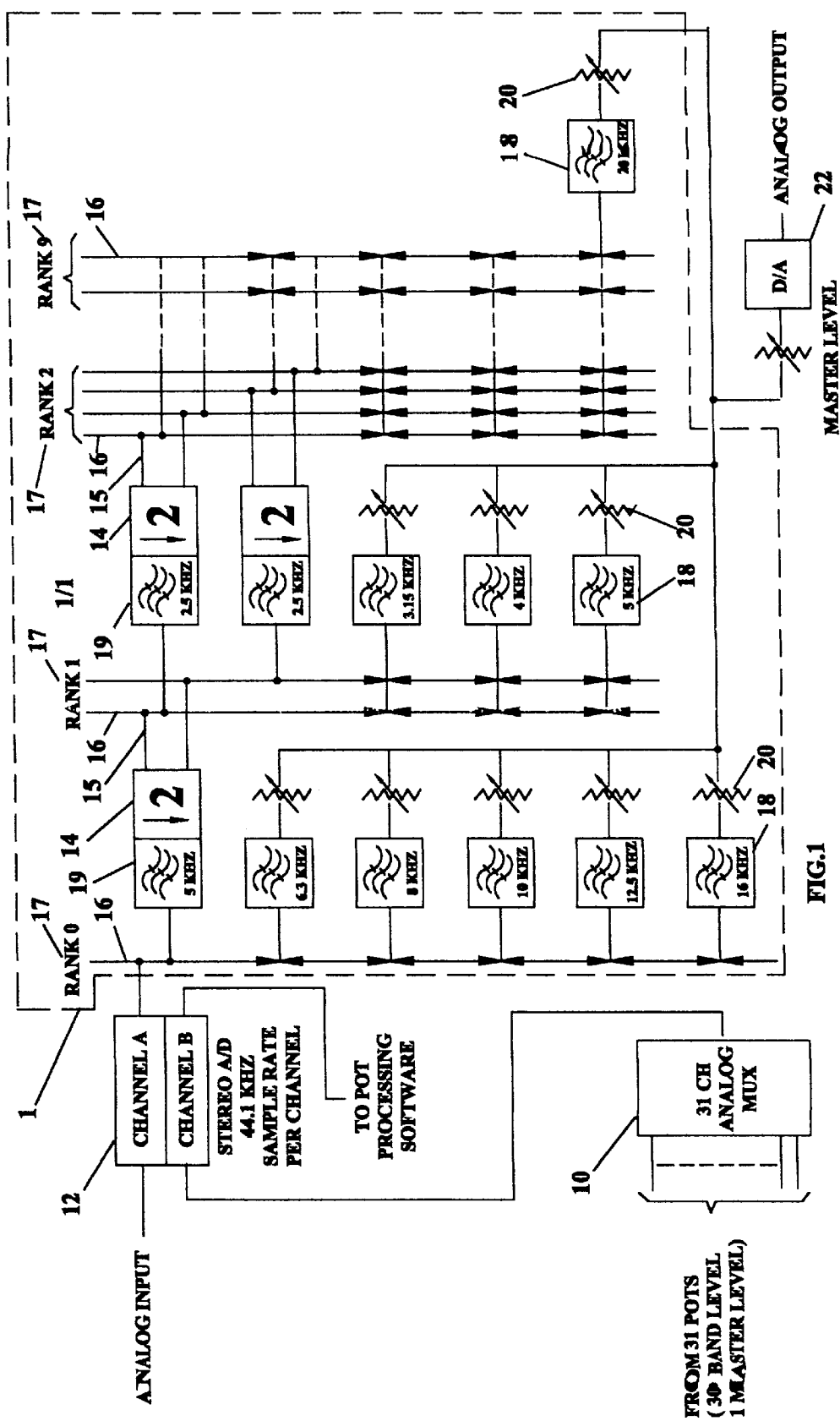

The method of direct calculation for FIR filters requires too much computing power to be commercially viable using currently available programmable digital signal processors, DSP or DFDP, as a means of implementing real-time audio equalizers. The basic reason for this inefficiency lies in the fact that FIR filters are only optimally efficient when their corner frequencies are above a certain fraction of the sampling frequency; below that, most of the samples are wasted in performing a redundant anti-aliasing function which could have been accomplished more efficiently in a separate filter stage designed for such a purpose. For example, in the design of a fairly efficient filter, one filter stage could be used as an anti-aliasing filter. The DFDP products currently available including supporting software design tools may be used to formulate such a filter. For the audio frequency range of interest, a filter with a low pass filter having a sample rate of 44.1 kilohertz, pass band at 5 kilohertz, pass band ripple of 0.02 and stop band ripple of 0.00002 using the Parks-McClellan algorithm and a length of 32 taps could be realized. With this structure the maximum stop band leakage is 88.3 decibels down when allowing for 16-bit coefficient rounding. However, the corner frequency of the filter is no lower than approximately 11% of the sampling rate. If the corner frequency is reduced to 5% of the sampling rate or lower, there is a significant reduction in filter efficiency. This loss of efficiency, or phenomenon, may be described as a rate inversion, meaning that the attempt to operate the filter at such a lowered frequency has severely compromised efficiency as was discussed in the low frequency band pass filter herein.

A significant cause of the FIR filter inefficiency in use appears to be the ignoring or non-use of multiple outputs produced at each sample rate of a staged filter. The traditional design approach for filters in which the throughput must be the same as the input sample rate is to specify filter stages with down sampling or dividing by a factor of N, that is, anti-alias filtering to a new sample rate followed by decimation by N, to provide a single output resultant frequency and not N outputs. This is usually considered sufficient as all other possible outputs at the same sample rate carry the same information except for phase with the implication the phase information is virtually insignificant for the filter process. Historically, this seems to have occurred as most sampling applications have been for the intended purpose of reducing bulk storage requirements or real-time bandwidth demands for communication links. As part of such processing, in a later stage the samples must be up sampled or multiplied for the individual filter outputs using output reconstruction filters for each rate with a filter order, or number of taps, approximately equal to the orders of the filters which would be required by direct calculation. This process thus loses most of the efficiency of the calculation method.

Referring to FIG. 1, a new filter design for use of the sampling process multiple output elements at each stage of filtering and decimation is illustrated. For the preferred embodiment frequency band of interest for an audio equalizer the decimation factor has been illustrated as uniformly 2 at each filter stage and both outputs, a subset of the more general N outputs if a factor of N were used, are used for the subsequent filter stage or rank. This structure at each rank wherein the sample rate is changed after the first or 0 rank therefore resembles the polyphase filters which currently exist in filter technology. It is important to note that in implementing such a filter in a digital signal processor (1), the filter is realized in a hardware unit for which software or firmware is developed to structure the processor for executing the digital filter signal processing function. To implement this filter, an input analog multiplexer (10) and a two channel input signal analog-to-digital converter (12) are linked and condition the input signal. Likewise an output signal digital-to-analog converter (22) is illustrated.

In such a programmable digital signal processor (1) structure the busses illustrated as vertical lines at each rank or stage are implemented as a specific 32-word buffer (16), so that the collection of all buffers (16) of a given sampling rate are known as its rank (17) where a particular rank (17) which is n consists of $2^n$ buffers (17) and the sampling rate of any particular rank (17) which is n times $2^n$ is always equal to the output aggregate sample rate. However, in practice, identical coefficients are used in all filter stages rather than requiring calculation of the filter stage at the higher reference rate and using every nth coefficient in each channel. This reduces the amount of coefficient storage required and avoids the possibility of creating audible phase artifacts or discontinuities when transitioning from the prior stage of decimation to the next stage of decimation, although in practice this might only prove to be audible for decimation factors considerably greater than 2.

The preferred embodiment implementation in FIG. 1 with a 10 stage rank appears to require a matrix of 1023 buffers (16) which all must be kept updated in real time. This would be true for such a filter implementation in the current art wherein only one decimation output (15) is used and the decimation results must be reconstructed or interpellated as for example described in the article by Paul H. Kraght, Journal Audio Engineering Society, Vol. 40, No. 5, 1992, May. However, upon closer inspection it can be seen that the filter as a whole may be kept current if only one buffer (16) out of each rank (17) is updated at each sample time or period since there is only one new sample point generated per rank (17) in each sample period. Stated differently, each new sample must generate its own path through the matrix and there is only one correct next path through the matrix which will keep each filter stage updated exactly when required by each sample period.

Referring to the 10 stage illustrated filter, each filter stage has a number of low pass filters (19) equivalent to the prior stage decimator (14) count which is incremented as a binary factor in rank order. The binary factor being a function of the use of both decimator outputs (15) for all decimators (14) in each stage. Therefore, the initial rank 0 or input has a single low pass filter (19) and decimator (14) together with band pass filters (18) for the intermediate frequencies with programmed or digital potentiometers (20) to balance output. Similarly rank 1 has two low pass filters (19) and decimators (14) for processing in alternating sample periods the two decimator outputs (15) received from two circular memory buss buffers (16). This processing proceeds to increase in an ordered binaural progression in similar manner at each stage. The final product of this filter process is complete sample frequency information for each of the frequency bands of interest for equalizer control without the need to use subsequent filter stages to interpolate to the input frequency sample. This process by eliminating the need for interpolation thereby reduces the computational requirements for a signal processor by up to an order of magnitude.

In order to best realize this computational efficiency, the digital signal processor (1) must maintain information relative to the sample period times or periods to calculate the next filter update. This does not require keeping information on each stage or rank and each filter which would be a significant memory and computational burden. Determining the sample period stage can be maintained based on the total number of ranks (17) of the filter and whether the intermediate buffers (16) are implemented as linear or circular buffers.

For the preferred embodiment illustrated, there are 9 decimation filter ranks in addition to the filters operating at the input sample rate. The intermediate data is stored in circular buffers (16). The ten pointers can be computed from a special register called the system state vector by using simple Boolean algebra and by proper selection of the particular memory scheme the next value for the state vector is calculated by simply incrementing by 1. If the buffers (16) were linear instead of circular, there would be no buffer start and buffer end registers, the masks would look slightly different and the increment would of course be by 32 instead of 1. One implementation of the state vector would include memory structured in order to force the buffers into the upper 32 kilowords of a 64 kiloword memory area, in order to use exclusively off-chip and contiguous memory as would be required on a Texas Instruments TMS320C51 or similar processor. Another example of a currently known processor for implementing the process is the Motorola DSP 56362.

While the invention has been particularly shown and described with respect to the illustrated and preferred embodiments thereof, it will be understood by those skilled in the art that the foregoing and other changes in form and details may be made therein without departing from the spirit and scope of the invention.

I claim:

1. A digital audio equalizer comprising:

an input signal analog to digital converter which samples an audio frequency signal which output is connected to a buffer;

the buffer output connected to a plurality of low pass filters and band pass filters at selected subfrequencies of the sampled audio frequency signal;

each low pass filter including an anti-aliasing filter which output signal is processed by a rank m decimator to reduce the low pass filter sample rate by a factor of n and produce m decimator outputs;

a rank m low pass filter receives each of the m filter sample rate outputs of the rank m decimators and outputs the signal by an m+1 filter stage buffer to a plurality of m+1 low pass filters with anti-aliasing filters which output signals are each processed by a rank m+1 decimator to reduce the m low pass filter sample rate by a factor of n and which output signals are processed by rank m+1 band pass filters;

a means to select, sum and scale each rank m and m+1 band pass filter at a selected time in the signal processing cycle;

a value of m such that the number of low pass filters and band pass filters substantially processes the audio spectrum; and each band pass filter connected to an output signal analog to digital converter.

2. The digital audio equalizer as in claim 1 wherein n is equal to 2.

3. The digital audio equalizer as in claim 1 wherein the rank is 10.

4. The digital audio equalizer as in claim 1 wherein the means to select, sum and scale is a plurality of programmable digital potentiometers.

5. A digital audio equalizer comprising:

a) a programmable digital signal processor operating in real time relative to a received signal input frequency comprising;

a plurality of programmable filter functions in rank order which are programmed as linear phase filters to filter the received signal input in a plurality of substantially independent frequency bands which linear phase filters include the functions of anti-aliasing and decimation and each filter rank retains a plurality of input samples to reduce the calculations required to perform the discrete time filter function and to inhibit rate inversion in each separate filter in each rank;

the programmable digital signal processor having a signal processing capacity sufficient to process the bandwidth of each of the independent frequency bands such that signal amplitude may be substantially independently adjusted;

a means for substantially independent adjustment of the independent frequency bands within the audio spectrum with a frequency resolution of at least one octane;

b) an input signal analog to digital converter; and c) an output digital to analog convertor.

6. The digital audio equalizer as in claim 5 wherein the digital audio equalizer elements are constrained to produce a linear-phase system response.

* * * * *